United States Patent
Ji et al.

(10) Patent No.: US 8,288,182 B2
(45) Date of Patent: Oct. 16, 2012

(54) METHOD FOR MANUFACTURING THIN FILM TRANSISTOR AND DISPLAY DEVICE

(75) Inventors: Young-Gil Ji, Yongin (KR); Deuk-Jong Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 12/929,212

(22) Filed: Jan. 7, 2011

(65) Prior Publication Data

US 2011/0171760 A1   Jul. 14, 2011

(30) Foreign Application Priority Data

Jan. 8, 2010 (KR) .................. 10-2010-0001977

(51) Int. Cl.
*H01L 51/56* (2006.01)
*H01L 21/3205* (2006.01)

(52) U.S. Cl. .......... 438/22; 438/149; 438/151; 438/660; 257/E51.018; 257/E21.294

(58) Field of Classification Search ............ 438/22, 438/660; 257/E51.018, E21.294
See application file for complete search history.

(56) References Cited

U.S. PATENT DOCUMENTS

| | | | | |
|---|---|---|---|---|
| 5,150,181 A | * | 9/1992 | Takeda et al. | 257/57 |
| 2002/0192938 A1 | * | 12/2002 | Wada et al. | 438/618 |
| 2003/0183820 A1 | * | 10/2003 | Park et al. | 257/66 |
| 2004/0002180 A1 | * | 1/2004 | Kim et al. | 438/73 |
| 2009/0218575 A1 | * | 9/2009 | Miyake et al. | 257/72 |

FOREIGN PATENT DOCUMENTS

| | | |
|---|---|---|
| KR | 1020020025330 | 4/2002 |
| KR | 1020040071494 A | 8/2004 |
| KR | 1020070118151 A | 12/2007 |

* cited by examiner

*Primary Examiner* — Angel Roman
(74) *Attorney, Agent, or Firm* — Robert E. Bushnell, Esq.

(57) ABSTRACT

A method for manufacturing a thin film transistor includes: forming a source electrode and a drain electrode on a substrate by depositing a metal layer on the substrate at a first temperature and etching the metal layer; forming a protective layer on the source and drain electrodes; and performing a heat treatment on the protective layer at a second temperature higher than the first temperature.

7 Claims, 11 Drawing Sheets

| | Deposition temperature | Heat treatment temperature | Blurring | Image |
|---|---|---|---|---|
| Test Example 1 | 280°C | 330°C | No | |
| | 280°C | | No | |
| | 280°C | | No | |
| | 280°C | | No | |
| | 280°C | | No | |
| | 280°C | | No | |
| | 280°C | | No | |
| | 280°C | | No | |
| Test Example 2 | 300°C | 330°C | No | |
| | 300°C | | No | |
| | 300°C | | No | |
| | 300°C | | No | |
| | 300°C | | No | |
| | 300°C | | No | |
| | 300°C | | No | |
| | 300°C | | No | |
| Test Example 3 | 310°C | 330°C | No | |
| | 310°C | | No | |
| | 310°C | | No | |
| | 310°C | | No | |
| | 310°C | | No | |
| | 310°C | | No | |
| | 310°C | | No | |
| | 310°C | | No | |
| Test Example 4 | 320°C | 330°C | No | |
| | 320°C | | No | |
| | 320°C | | No | |
| | 320°C | | No | |
| | 320°C | | No | |
| | 320°C | | No | |
| | 320°C | | No | |
| | 320°C | | No | |
| Comparative Example | | 330°C | Yes | |
| | | | Yes | |
| | | | Yes | |
| | | | Yes | |
| | | | Yes | |
| | | | Yes | |
| | | | Yes | |

METHOD FOR MANUFACTURING THIN FILM TRANSISTOR AND DISPLAY DEVICE

CLAIM OF PRIORITY

This application claims priority to and the benefit of Korean Patent Application No. 10-2010-0001977 filed in the Korean Intellectual Property Office on Jan. 8, 2010, the entire contents of which are incorporated herein by reference.

BACKGROUND OF THE INVENTION

1. Field of the Invention

The described technology relates generally to a method for manufacturing a thin film transistor. More particularly, the described technology relates generally to a method for manufacturing a thin film transistor including performing heat treatment and a method for manufacturing a display device.

2. Description of the Related Art

A display device is a device that displays an image. Recently, an organic light emitting diode display has been drawing attention.

An organic light emitting diode display has self-luminous characteristics, and because the organic light emitting diode display does not need a separate light source, unlike a liquid crystal display, it can have a relatively small thickness and weight. In addition, the organic light emitting diode display exhibits high-quality characteristics such as low power consumption, high luminance, high response speed, etc.

A conventional organic light emitting diode display includes at least one thin film transistor including a source electrode and a drain electrode. The source electrode and drain electrode of the thin film transistor are formed by forming a metal layer on a substrate by a deposition process such as chemical vapor deposition (CVD), and etching the metal layer.

However, the metal layer formed by a deposition process such as chemical vapor deposition has the problem of defects such as vacancies of a nano-size or micro-size generated in the source and drain electrodes formed from the metal layer because the molecules of the metal layer are not formed densely.

As such, when defects are generated in the source and drain electrodes, the flow of current through the thin film transistor is delayed due to the defects, thus generating blurring or the like on an image displayed by an organic light emitting diode display including the thin film transistor and deteriorating the overall display quality of the organic light emitting diode display.

The above information disclosed in this Background section is only for enhancement of understanding of the background of the described technology and therefore it may contain information that does not form the prior art that is already known in this country to a person of ordinary skill in the art.

SUMMARY OF THE INVENTION

One exemplary embodiment has been made to solve the above problem, and provides a method for manufacturing a thin film transistor and a method for manufacturing a display device that suppresses the generation of defects in a source electrode and a drain electrode.

To achieve the above technical solution, a first aspect of the present invention provides a method for manufacturing a thin film transistor, including: forming a source electrode and a drain electrode on a substrate by depositing a metal layer on the substrate at a first temperature and etching the metal layer; forming a protective layer on the source and drain electrodes; and performing heat treatment on the protective layer at a second temperature higher than the first temperature.

The first temperature may be 280° C. to 320° C.

The second temperature may be approximately 330° C.

The deposition of the metal layer may be performed using a chemical vapor deposition process.

The source electrode and the drain electrode may be made of aluminum, and the protective layer may be made of at least one of silicon nitride ($SiN_x$) and silicon oxide ($SiO_x$).

Furthermore, a second aspect of the present invention provides a method for manufacturing a thin film transistor, including: forming a source electrode and a drain electrode constituting a thin film transistor on a substrate by depositing a metal layer on the substrate at a first temperature and etching the metal layer; forming a protective layer on the source and drain electrodes; and performing heat treatment on the protective layer at a second temperature higher than the first temperature.

The first temperature may be 280° C. to 320° C.

The second temperature may be substantially 330° C.

The deposition of the metal layer may be performed using a chemical vapor deposition process.

The source electrode and the drain electrode may be made of aluminum, and the protective layer may be made of at least one of silicon nitride (SiNx) and silicon oxide (SiOx).

The method may further include sequentially forming a first electrode, an organic emission layer, and a second electrode on the source and drain electrodes.

According to one of several exemplary embodiments of the solution of the present invention, there is provided a method for manufacturing a thin film transistor and a method for manufacturing a display device that suppress the generation of defects in a source electrode and a drain electrode.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 5 to 8 are views explaining the method for manufacturing an organic light emitting diode display according to an exemplary embodiment;

DETAILED DESCRIPTION

Hereinafter, exemplary embodiments will be described in detail with reference to the accompanying drawings such that those skilled in the art can easily carry out the present. As those skilled in the art would realize, the described embodiments may be modified in various different ways, all without departing from the spirit or scope of the present invention.

To clearly describe the exemplary embodiments, parts not related to the description are omitted, and like reference numerals designate like constituent elements throughout the specification.

In the drawings, the sizes and thicknesses of the components are merely shown for convenience of explanation, and therefore the present invention is not necessarily limited to the illustrations described and shown herein.

In the drawings, the thickness of layers, films, panels, regions, etc., are exaggerated for clarity. In the drawings, the thicknesses of some layers and areas are exaggerated for convenience of explanation. When it is described that one element such as a layer, a film, an area, a plate, etc. is formed on another element, it means that one element exists right on another element or that one element exists on another element with a further element therebetween.

Throughout this specification and the claims that follow, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Although the following description will be given with respect to an organic light emitting diode display including at least one thin film transistor as a typical example of a display device according to an exemplary embodiment, a display device according to another exemplary embodiment may be a liquid crystal display (LCD), etc., including at least one thin film transistor.

Hereinafter, an organic light emitting diode display 101 manufactured according to an exemplary embodiment will be first described with reference to FIGS. 1 to 3.

Figure 1:
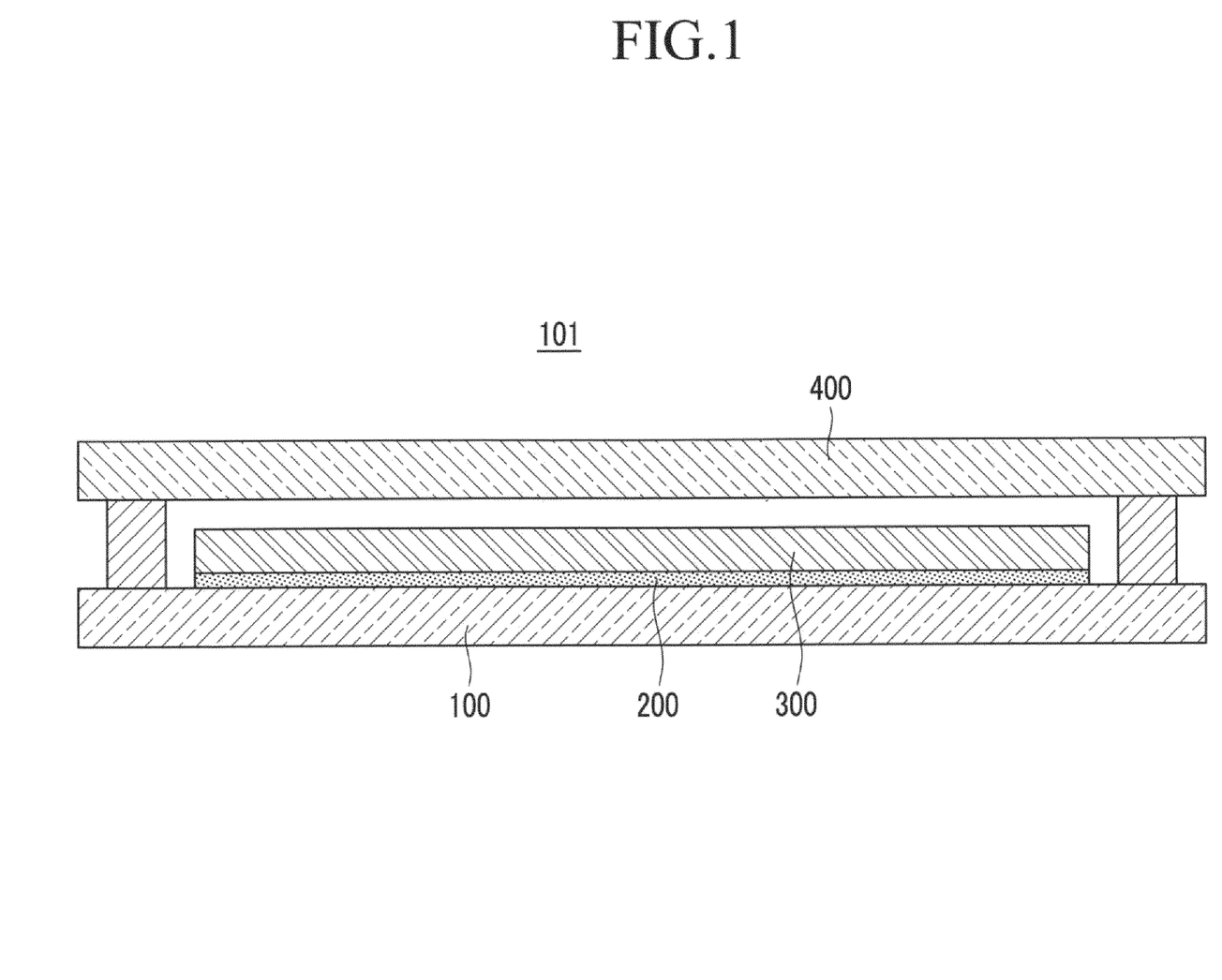
FIG. 1 is a cross-sectional view showing an organic light emitting diode display manufactured according to an exemplary embodiment.

FIG. 1 is a cross-sectional view showing an organic light emitting diode display manufactured according to an exemplary embodiment.

As shown in FIG. 1, the organic light emitting diode display 101 manufactured according to an exemplary embodiment includes a first substrate 100, a wiring portion 200, an organic light emitting diode 300, and a second substrate 400.

The first substrate 100 and the second substrate 400 are light transmissive and electrically insulative substrates including glass, a polymer, or the like. The first substrate 100 and the second substrate 400 face each other, and are bonded together by a sealant. The wiring portion 200 and the organic light emitting diode 300 are positioned between the first substrate 100 and the second substrate 400, and the first substrate 100 and the second substrate 400 protect the wiring portion 200 and the organic light emitting diode 300 from external interference.

The wiring portion 200 includes switching and driving thin film transistors 10 and 20 (shown in FIG. 2), and transmits a signal to the organic light emitting diode 300 to drive the organic light emitting diode 300. The organic light emitting diode 300 emits light according to a signal received from the wiring portion 200.

The organic light emitting element 300 is positioned on the wiring portion 200.

The organic light emitting diode 300 is positioned in a display area on the first substrate 100. The organic light emitting diode 300 receives a signal from the wiring portion 200, and displays an image by the received signal.

Hereinafter, the internal structure of the organic light emitting diode display 101 according to the exemplary embodiment will be described in detail with reference to FIGS. 2 and 3.

Figure 2:
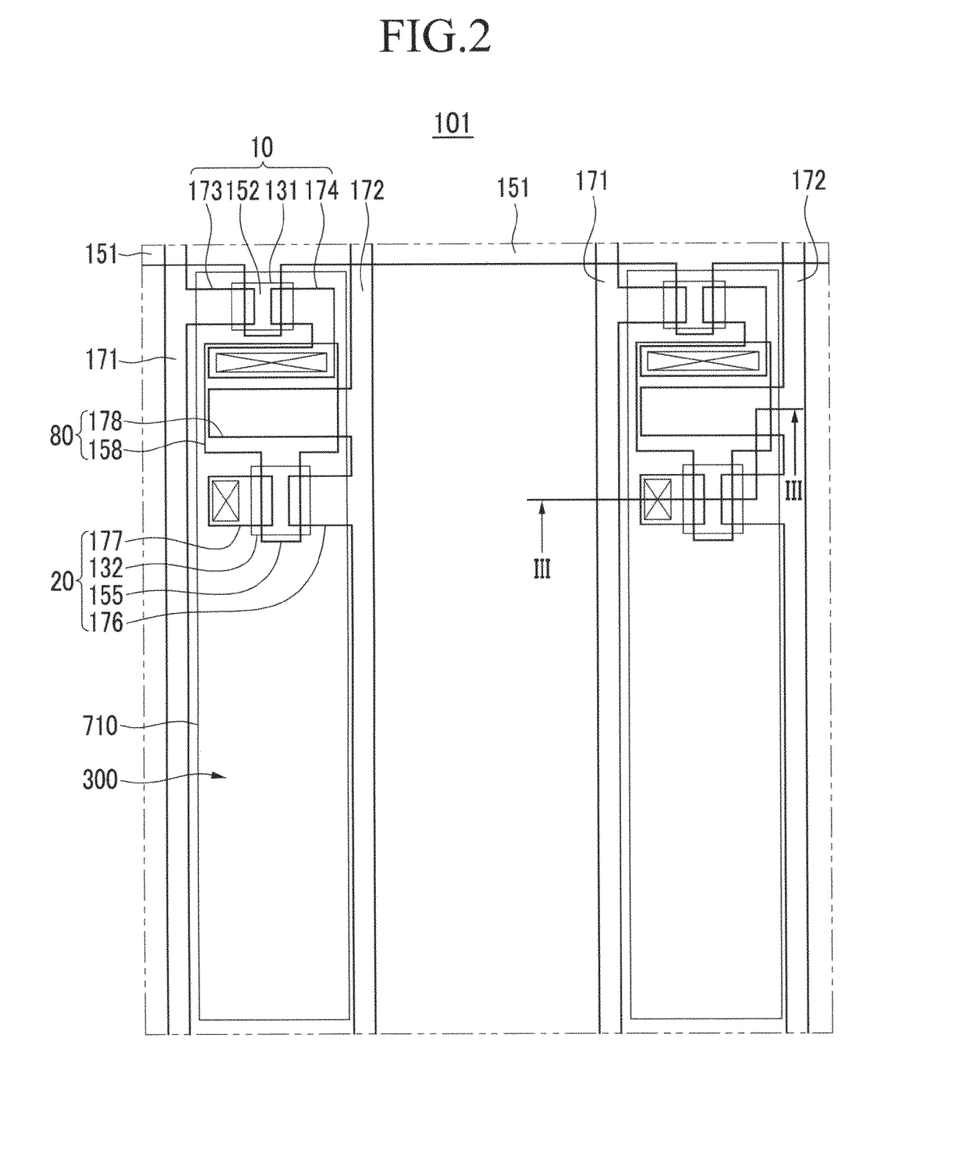
FIG. 2 is a layout view showing the structure of a pixel of the organic light emitting diode display manufactured according to the exemplary embodiment.

FIG. 2 is a layout view showing the structure of a pixel of the organic light emitting diode display manufactured according to the exemplary embodiment. FIG. 3 is a cross-sectional view taken along line of FIG. 2.

Figure 3:
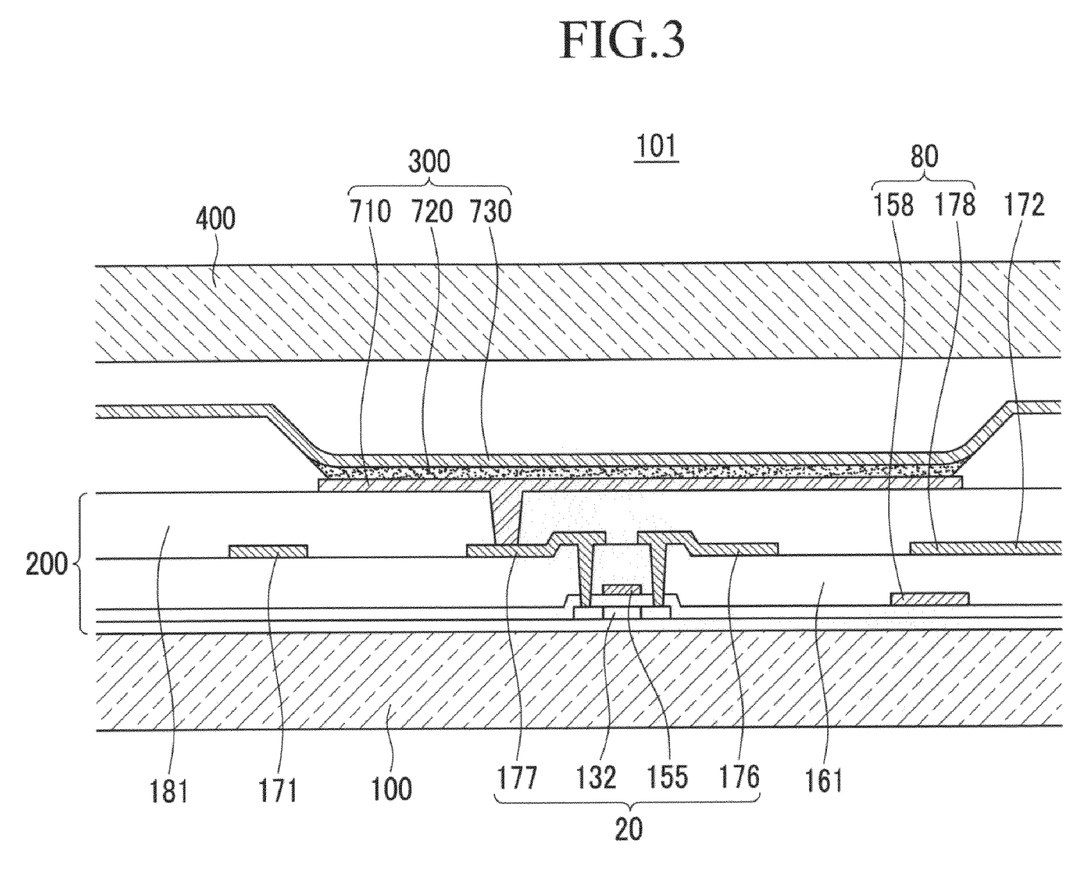
FIG. 3 is a cross-sectional view taken along line III-III of FIG. 2.

Concrete structures of the wiring portion 200 and the organic light emitting diode 300 are shown in FIGS. 2 and 3, but the exemplary embodiment is not limited to the structures shown in FIGS. 2 and 3. The wiring portion 200 and the organic light emitting diode 300 may have various structures within the scope in which a person skilled in the art may easily change. For example, although the accompanied drawings illustrate an active matrix (AM)-type organic light emitting diode display having a 2Tr-1Cap structure as a display device in which one pixel includes two thin film transistors (TFTs) and one capacitor, the present invention is not limited thereto. Therefore, the number of thin film transistors, the number of capacitors, and the number of lines of the display device are not limited. A pixel refers to the smallest unit displaying an image, and the display device displays an image through a plurality of pixels.

As shown in FIGS. 2 and 3, each pixel of the organic light emitting diode display 101 includes a switching thin film transistor 10, a driving thin film transistor 20, a capacitor 80, and an organic light emitting diode 300. Here, a component including the switching thin film transistor 10, the driving thin film transistor 20, and the capacitor 80 is referred to as the wiring portion 200. The wiring portion 200 further includes a gate line 151 arranged along one direction of the first substrate 100, a data line 171 insulated from and crossing the gate line 151, and a common power line 172. One pixel may be defined by the gate line 151, the data line 171, and the common line 172, but the present invention is not necessarily limited thereto.

The organic light emitting diode 300 includes a first electrode 710, an organic emission layer 720 positioned on the first electrode 710, and a second electrode 730 positioned on the organic emission layer 720.

The first electrode 710 is an anode serving as a hole injection electrode, and the second electrode 730 is a cathode serving as an electron injection electrode. However, the exemplary embodiment is not necessarily limited thereto, and the pixel electrode 710 may be a cathode and the common electrode 730 may be an anode according to a driving method of the organic light emitting diode display 101. That is, holes and electrons are injected into the organic emission layer 720 from the first electrode 710 and the second electrode 730, respectively, and when excitons formed by recombination of the injected holes and electrons drop from an excited state to a ground state, the organic emission layer 720 emits light. Moreover, at least one of the first electrode 710 and the second electrode 730 transmits one part of light and reflects the other part of the light. At least one of the first electrode 710 and the second electrode 730 includes a single or multiple layered semi-transmissive conductive layer containing at least one of lithium (Li), aluminum (Al), calcium (Ca), magnesium (Mg), silver (Ag), to magnesium-silver (MgAg), lithium aluminum (LiAl), indium tin oxide (ITO), and indium zinc oxide (IZO).

As such, in the organic light emitting diode display 101 according to one exemplary embodiment, the organic light emitting diode 300 emits light in at least one of the directions of the first substrate 100 and the second substrate 400. That is, the organic light emitting diode display 101 may be a top-emission type, a bottom-emission type, or a dual-emission type.

The capacitor 80 includes a pair of capacitor plates 158 and 178 disposed with an interlayer insulating film 161 interposed therebetween. Here, the interlayer insulating film 161 is a dielectric material, and the storage capacity of the capacitor 80 is determined by the electric charges stored in the capacitor 80 and the voltage between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a drain electrode 177.

The switching thin film transistor 10 is used as a switching element to select a pixel to emit light. The switching gate electrode 152 is connected to the gate line 151. The switching source electrode 173 is connected to the data line 171. The switching drain electrode 174 is spaced apart from the switching source electrode 173 and connected to the capacitor plate 158.

The driving thin film transistor 20 receives driving power, which is a signal for allowing the organic emission layer 720 of the organic light emitting diode 300 to emit light, from the common power line 172, and applies it to the first electrode 710. The driving gate electrode 155 is connected to the capacitor plate 158 connected to the switching drain electrode 174. The driving source electrode 176 and the other capacitor plate 178 are connected to the common power line 172 and extend from the common power line 172. The driving drain electrode 177 is connected to the first electrode 710 of the organic light emitting diode 300 via a contact hole formed in a protective layer 181.

With the above-described configuration, the switching thin film transistor 10 is driven by a gate voltage applied to the gate line 151, and supplies a data voltage applied to the data line 171 to the driving thin film transistor 20. A voltage corresponding to the difference between the common voltage, which is supplied from the common power line 172 to the driving thin film transistor 20, and the data voltage, which is supplied from the switching thin film transistor 10, is stored in the capacitor 80. A current corresponding to the voltage stored in the capacitor 80 flows into the organic light emitting diode 300 through the driving thin film, transistor 20 to make the organic light emitting diode 300 emit light.

Meanwhile, the data line 171, the switching source electrode 173, the switching drain electrode 174, the driving source electrode 176, the driving drain electrode 177, and the capacitor plate 178 are disposed on the interlayer insulating film 161, and the protective layer 181 is disposed on the data line 171, the switching source electrode 173, the switching drain electrode 174, the driving source electrode 176, the driving drain electrode 177, and the capacitor plate 178. The data line 171, the switching source electrode 173, the switching drain electrode 174, the driving source electrode 176, the driving drain electrode 177, and the capacitor plate 178 are formed by etching the same metal layer formed by a micro-electro-mechanical systems (MEMS) process, such as photolithography. The data line 171, the common power line 172, the switching source electrode 173, the switching drain electrode 174, the driving source electrode 176, the driving drain electrode 177, and the capacitor plate 178 are formed of the same conductive material because they are formed by etching the same metal layer. The data line 171, the common power line 172, the switching source electrode 173, the switching drain electrode 174, the driving source electrode 176, the driving drain electrode 177, and the capacitor plate 178 are made of aluminum (Al), and have a thickness of 500 Å to 10,000 Å. Within this range, the data line 171, the common power line 172, the switching source electrode 173, the switching drain electrode 174, the driving source electrode 176, the driving drain electrode 177, and the capacitor plate 178 may approximately have a thickness of 5200 Å. The protective layer 181 is an inorganic film made of at least one of silicon nitride (SiNx) and silicon oxide (SiOx), and has a thickness of about 500 Å to about 10,000 Å. Within this range, the protective layer 181 may approximately have a thickness of 3000 Å. Molecules of the data line 171, the common power line 172, the switching source electrode 173, the switching drain electrode 174, the driving source electrode 176, the driving drain electrode 177, and the capacitor plate 178 have a dense structure, and, with the dense structure thereof, a current moving to the first electrode 710 through these components is not delayed. The principle of the formation of the dense structure of the data line 171, the common power line 172, the switching source electrode 173, the switching drain electrode 174, the driving source electrode 176, the driving drain electrode 177, and the capacitor plate 178 will be described later.

Now, a method for manufacturing an organic light emitting diode display according to one exemplary embodiment will be described with reference to FIGS. 3 to 8. The following description of the switching thin film transistor 10 and the driving thin film transistor 20 included in the above-stated organic light emitting diode display 101 will be given with respect to a portion where the driving thin film transistor 20 is disposed, for convenience of explanation.

Figure 4:
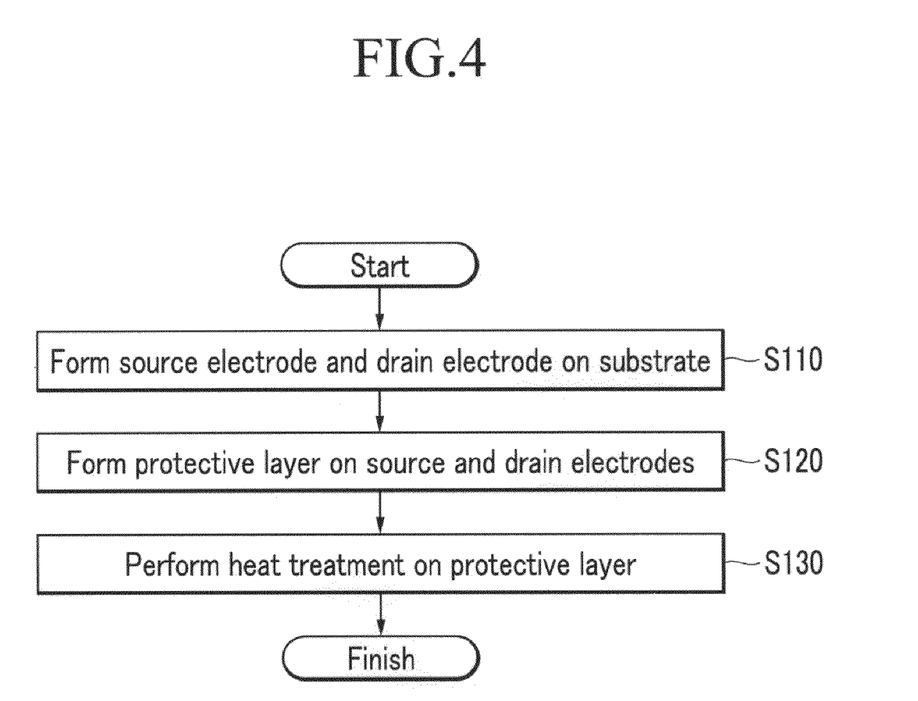
FIG. 4 is a flowchart showing a method for manufacturing an organic light emitting diode display according to an exemplary embodiment.

FIG. 4 is a flowchart showing a method for manufacturing an organic light emitting diode display according to one exemplary embodiment. FIGS. 5 to 8 are views explaining the method for manufacturing an organic light emitting diode display according to one exemplary embodiment.

As shown in FIGS. 4 to 7, first, a data line 171, a driving source electrode 176, a driving drain electrode 177, a capacitor plate 178, and a common power line 172 are formed on a first substrate 100 (S110).

Figure 5:
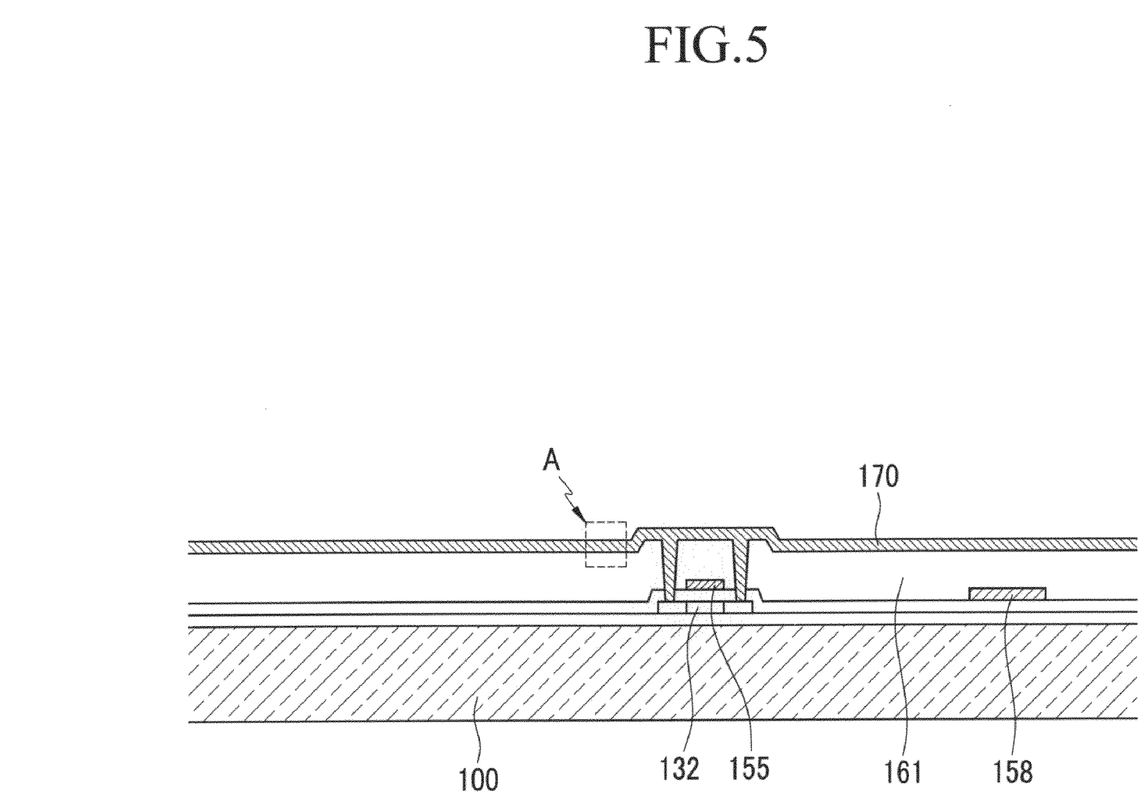
Figure 11:
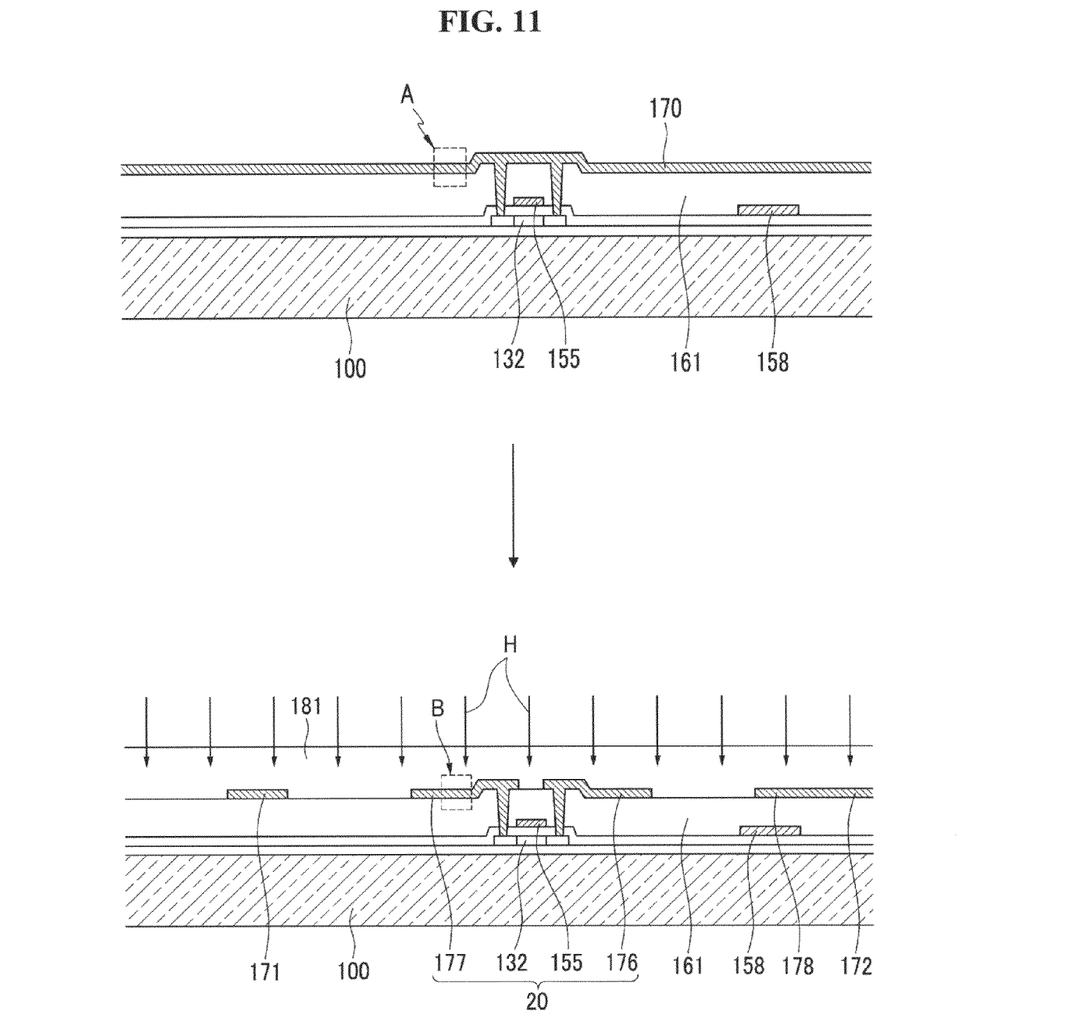
FIG. 11 shows the sequence of fabrication of an organic light emitting diode display of the present invention.

Specifically, first, as shown in FIGS. 5 and 11, a driving semiconductor layer 132, a driving gate electrode 155, a capacitor plate 158, and an interlayer insulating film 161 are formed on the first substrate 100, and then a metal layer 170 is formed on the interlayer insulating film 161. The metal layer is formed on the interlayer insulating film 161 by chemical vapor deposition (CVD) using aluminum as a deposition means. That is, the metal layer 170 is made of aluminum, and has a thickness of 500 Å to 10,000 Å. Within this range of thickness, the metal layer 170 may substantially have a thickness of 5200 Å. The metal layer 170 is formed on the interlayer insulating film 161 at a first temperature of 280° C. to 320° C.

Defects such as vacancies are generated inside the metal layer 170 formed on the interlayer insulating film 161, which will be described with reference to FIG. 6.

Figure 6:
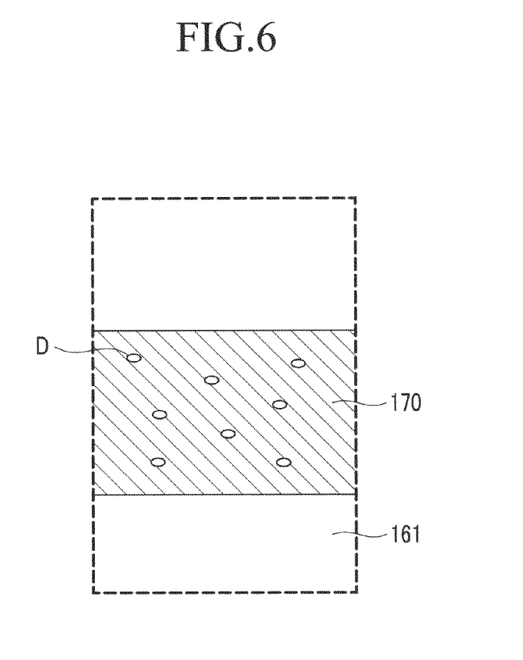
FIG. 6 is an enlarged view of portion A of FIGS. 5 and 11.

FIG. 6 is an enlarged view of portion A of FIGS. 5 and 11.

As shown in FIG. 6, when the metal layer 170 is formed on the interlayer insulating film 161 by chemical vapor deposition at a first temperature of 280° C. to 320° C. by being deposited on the interlayer insulating film 161 using the deposition means, the temperature of the molecules of the metal layer 170 is decreased, thus failing to provide sufficient mobility to the molecules of the metal layer 170. That is, defects D, such as vacancies, are generated in the metal layer 170 because the molecules of the metal layer 170 do not have sufficient mobility. These defects D serve to suppress the flow of current through the metal layer 170.

Figure 7:
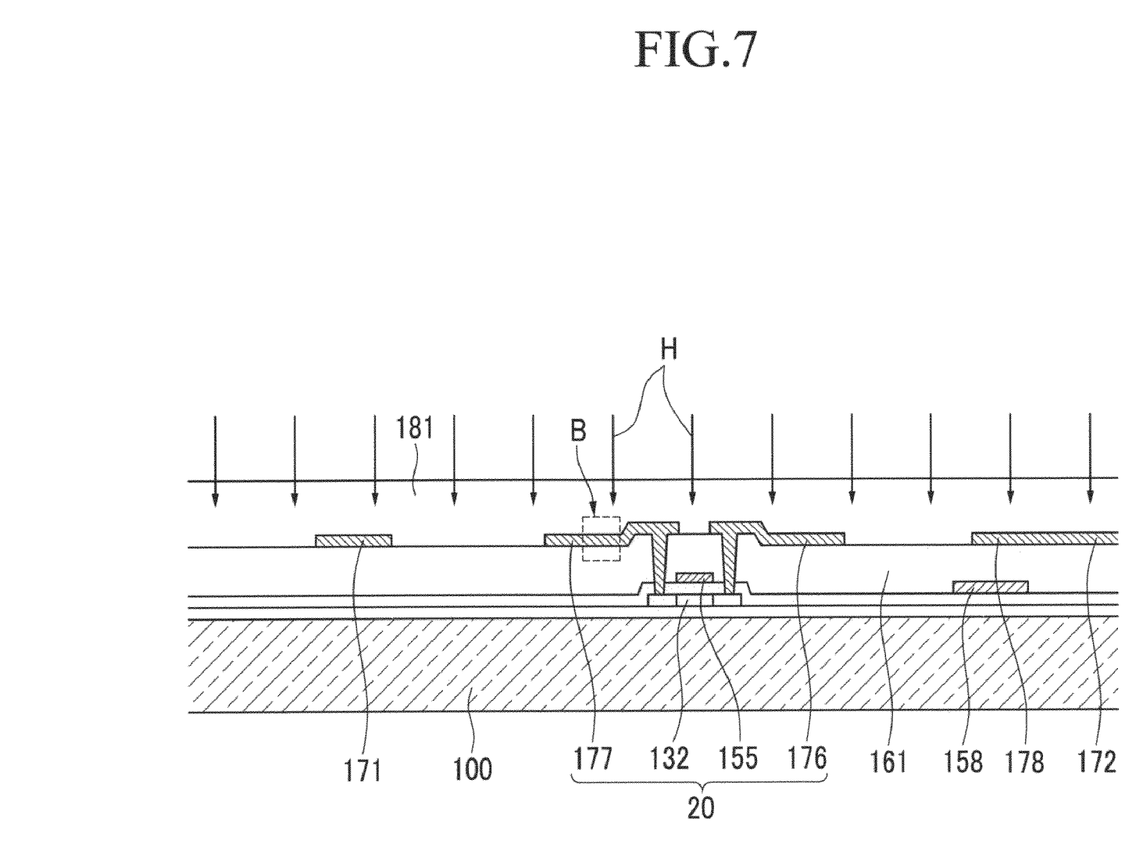

Next, as shown in FIGS. 7 and 11, a data line 171, a driving source electrode 176, a driving drain electrode 177, a capacitor plate 178, and a common power line 172 are formed by etching the metal layer 170 by a MEMS process, such as photolithography. The data line 171, the driving source electrode 176, the driving drain electrode 177, the capacitor plate 178, and the common power line 172 are made of aluminum, and have a thickness of about 500 Å to about 10,000 Å. The data line 171, the driving source electrode 176, the driving drain electrode 177, the capacitor plate 178, and the common power line 172 may have an approximate thickness of 5200 Å.

With the above process, even if the data line 171, the driving source electrode 176, the driving drain electrode 177, the capacitor plate 178, and the common power line 172 are formed from the metal layer 170, the defects D disposed in the metal layer 170 are still contained therein.

Next, a protective layer 181 is formed on the data line 171, the driving source electrode 176, the driving drain electrode 177, the capacitor plate 178, and the common power line 172 (S120).

Specifically, a protective layer 181, which is an inorganic film made of at least one of silicon nitride (SiNx) and silicon oxide (SiOx), is formed on the data line 171, the driving source electrode 176, the driving drain electrode 177, the capacitor plate 178, and the common power line 172. The protective layer 181 has a thickness of about 500 Å to about 10,000 Å, and may be formed with an approximate thickness of 3000 Å.

Next, the protective layer 181 is heat-treated (S130).

Specifically, the protective layer 181 is heat-treated at a second temperature higher than the first temperature of 280° C. to 320° C. at which the metal layer 170 is formed from the data line 171, the driving source electrode 176, the driving drain electrode 177, the capacitor plate 178, and the common power line 172. By heat-treating the protective layer 181, heat H is transferred through the protective layer 181 to the data line 171, the driving source electrode 176, the driving drain electrode 177, the capacitor plate 178, and the common power line 172, which are covered with the protective layer 181. This heat H allows the molecules of the above components to have a dense structure, thereby minimizing the generation of defects D, such as vacancies, therein.

The driving thin film transistor 20 is manufactured by the above process, and the switching thin film transistor 10, is simultaneously manufactured with the manufacture of the driving thin film transistor 20.

To sum up, defects D, such as vacancies, in the data electrode 171, the driving source electrode 176, the driving drain electrode 177, the capacitor plate 178, and the common power line 172, which are formed from the same metal layer 170, are minimized, thereby preventing a decrease in the flow of current moving to the first electrode 710 through the switching thin film transistor 10 and the driving thin film transistor 20 and preventing the overall display quality of the organic light emitting diode display 101 from being diminished.

As to the molecules of the data line 171, the driving source electrode 176, the driving drain electrode 177, the capacitor plate 178, and the common power line 172 having a dense structure for minimizing defects D by heat treatment using the protective layer 181, a description will be given by taking the driving drain electrode 177 as an example with reference to FIG. 8.

Figure 8:
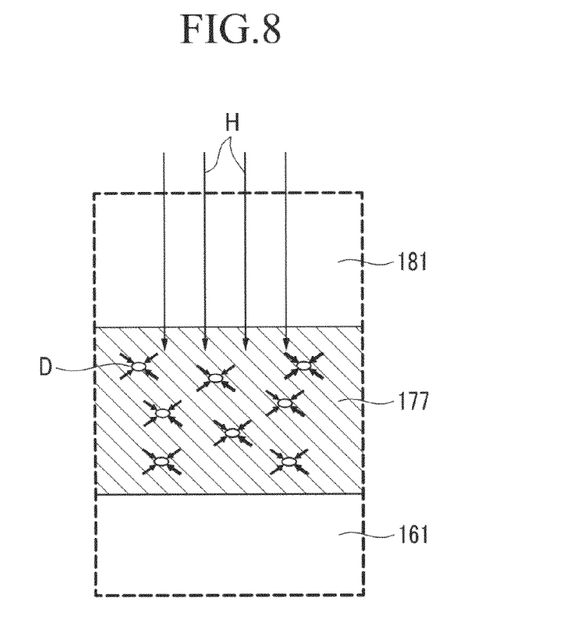
FIG. 8 is an enlarged view of portion B of FIGS. 7 and 11.

FIG. 8 is an enlarged view of portion B of FIG. 7.

As shown in FIG. 8, when heat H is applied to the driving drain electrode 177 formed from the metal layer 170 through the protective layer 181, the Gibbs free energy of the molecules of the driving drain electrode 177 is increased by the heat H, thus increasing the enthalpy and entropy of the molecules of the driving drain electrode 177. Particularly, the heat H transferred to the metal layer 170 through the protective layer 181 by heat treatment has the second temperature higher than the first temperature at which the metal layer 170 is deposited, thus increasing the enthalpy and entropy of the molecules of the driving drain electrode 177 to more than the enthalpy and entropy of the molecules obtained in the deposition of the metal layer 170. Due to this, the molecules of the driving drain electrode 177 are changed to an unstable state and the mobility of the molecules is increased, so that defects D such as vacancies generated in the driving drain electrode 177 are filled by movement of the molecules present in the vicinity of the defects D. That is, the protective layer 181 is heat-treated at the second temperature higher than the first temperature at which the metal layer 170 is deposited, thus allowing the molecules of the driving drain electrode 177 covered with the protective layer 181 to have a dense structure.

Afterwards, with the defects D being filled with the molecules, the mobility of the molecules is decreased by a reversible change of the molecules of the driving drain electrode 177 from the unstable state to a stable state, thus minimizing the defects D such as vacancies generated in the driving drain electrode 177 before heat treatment. That is, the molecules of the driving drain electrode 177 have a dense structure because of the heat H transmitted through the protective layer 181.

Since the molecules of each of the data line 171, the driving source electrode 176, the driving drain electrode 177, the capacitor plate 178, and the common power line 172 have a dense structure by the above-stated heat treatment of the protective layer 181, this minimizes a decrease in the flow of current moving to the first electrode 170 through the switching thin film transistor 10 and the driving thin film transistor 20. As a result, the display quality of the organic light emitting diode display 101 is improved.

Now, a test for confirming an improvement of the display quality of the organic light emitting diode display 101 manufactured according to an exemplary embodiment will be described with reference to FIG. 9.

Figure 9:
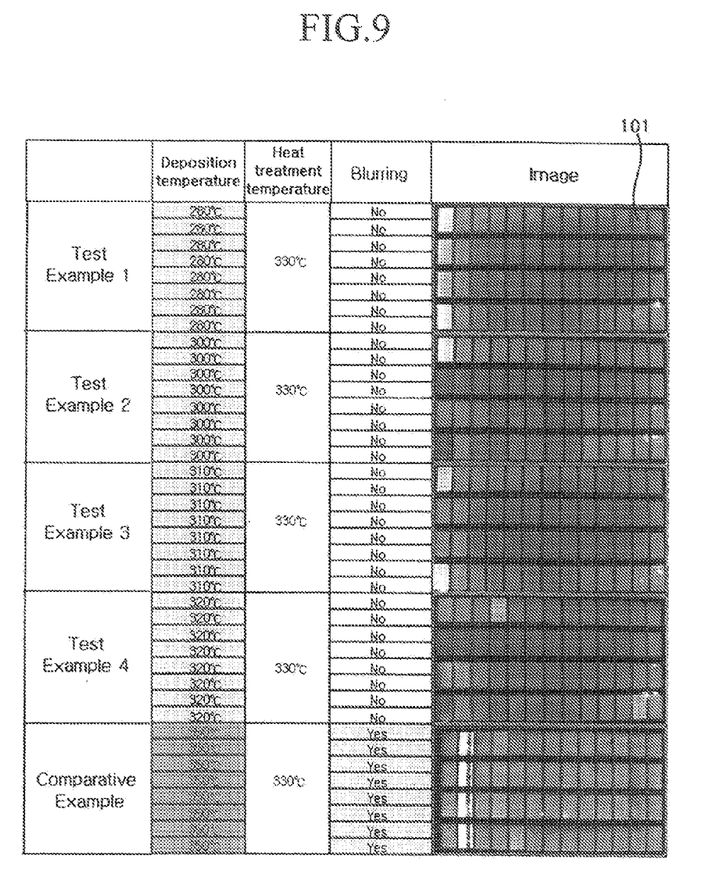
FIG. 9 is a table explaining a test for confirming improvement of the display quality of the organic light emitting diode display manufactured according to an exemplary embodiment.

FIG. 9 is a table explaining a test for confirming improvements of the display quality of organic light emitting diode displays manufactured according to an exemplary embodiment.

As shown in FIG. 9, first, Test Example 1 relates to an organic light emitting diode display 101 formed by depositing a metal layer 170 by chemical vapor deposition substantially at a first temperature of 280° C. and heat-treating the protective layer 181 at a second temperature of 330° C., Test Example 2 relates to an organic light emitting diode display 101 formed by depositing a metal layer 170 by chemical vapor deposition substantially at a first temperature of 300° C. and heat-treating the protective layer 181 at a second temperature of 330° C., Test Example 3 relates to an organic light emitting diode display 101 formed by depositing a metal layer 170 by chemical vapor deposition substantially at a first temperature of 310° C. and heat-treating the protective layer 181 at a second temperature of 330° C., and Test Example 4 relates to an organic light emitting diode display 101 formed by depositing a metal layer 170 by chemical vapor deposition substantially at a first temperature of 320° C. and heat-treating the protective layer 181 at a second temperature of 330° C. Moreover, the comparative example relates to an organic light emitting diode display 101 formed by depositing a metal layer 170 by chemical vapor deposition substantially at a first temperature of 350° C. and heat-treating the protective layer 181 at a second temperature of 330° C.

The data line 171, the common power line 172, the switching source electrode 173, the switching drain electrode 174, the driving source electrode 176, the driving drain electrode 177, and the capacitor plate 178, which are formed from the metal layer 170 included in the organic light emitting diode display according to each of Examples 1 through 4 and the comparative example, are made of aluminum (Al) and have a thickness of approximately 5200 Å, and the protective layer 181 is made of silicon oxide (SiOx) and silicon nitride (SiNx) and has a thickness of approximately 3000 Å.

As shown in FIG. 9, it was found that no blurring occurred to an image displayed by each of the organic light emitting diode displays 101 according to Test Examples 1 through 4, and that blurring occurred to an image, displayed by the organic light emitting diode display according to the comparative example. The patent or application file contains at least one drawing executed in color. Copies of this patent or patent application publication with color drawing(s) will be provided by the Office upon request and payment of the necessary fee.

That is, if the first temperature for depositing the metal layer 170 from which the data line 171, the common power line 172, the switching source electrode 173, the switching drain electrode 174, the driving source electrode 176, the driving drain electrode 177, and the capacitor plate 178 are formed is lower than the second temperature for heat-treating the protective layer 181 covering the above components, this suppresses the generation of defects therein, thereby improving the display quality of the organic light emitting diode display 101.

DESCRIPTION OF SYMBOLS

Figure 10:
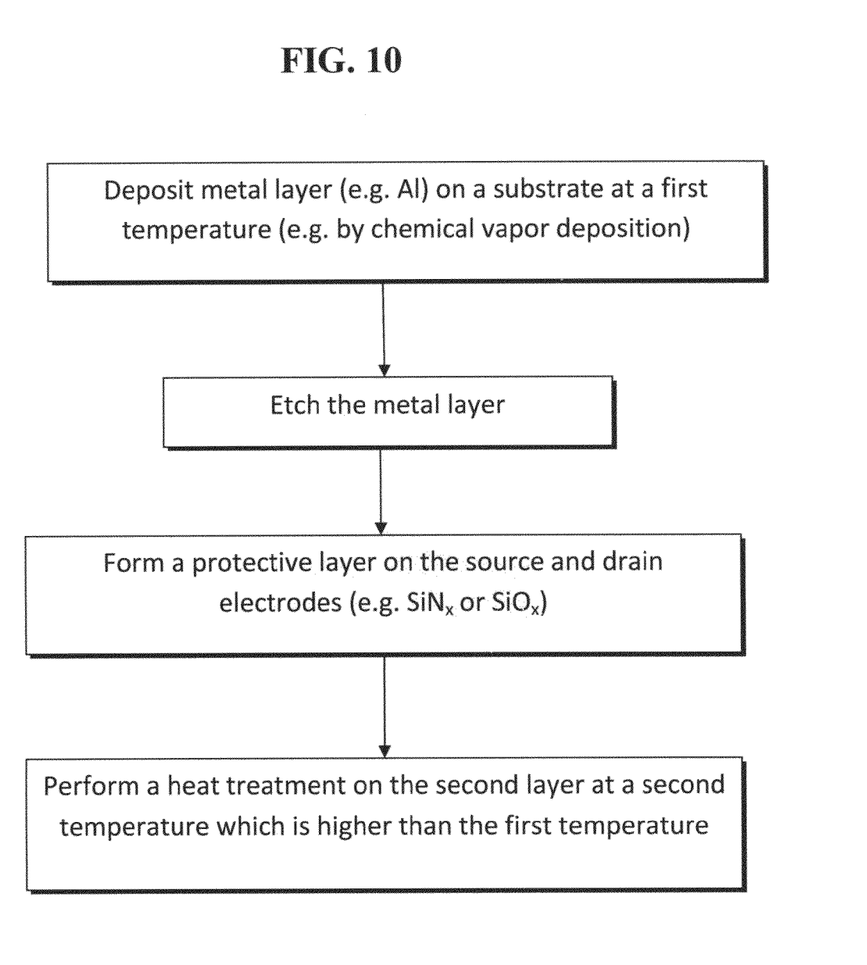
FIG. 10 is a flow chart showing another method of making an organic light emitting diode display of the present invention.

176: driving source electrode, 177: driving drain electrode, 181: protective layer FIG. 10 is a flow chart showing another method of making an organic light emitting diode display of the present invention. FIG. 11 shows the sequence of fabrication of an organic light emitting diode display of the present invention in which a metal layer (e.g. Al) is deposited onto a substrate at a first temperature (e.g. by chemical vapor deposition). Then, the metal layer is etched. A protective layer (e.g., $SiN_x$ or $SiO_x$) is then formed on the source and drain electrodes. The second layer is then subjected to a heat treatment at a second temperature which is higher than the first temperature.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor, comprising:
    forming a source electrode and a drain electrode on a substrate by depositing a metal layer on the substrate at a first temperature of about 280° C. to about 320° C. and etching the metal layer;
    forming a protective layer on the source and drain electrodes; and
    performing a heat treatment on the protective layer at a second temperature of about 330° C.

2. The method of claim 1, wherein the deposition of the metal layer is performed using a chemical vapor deposition process.

3. The method of claim 2, wherein the source electrode and the drain electrode comprise aluminum, and
    the protective layer comprises one or more of a silicon nitride ($SiN_x$) or a silicon oxide ($SiO_x$).

4. A method for manufacturing a thin film transistor, comprising:
    forming a thin film transistor including a source electrode and a drain electrode on a substrate by depositing a metal layer on the substrate at a first temperature of about 280° C. to about, 320° C. and etching the metal layer;
    forming a protective layer on the source and drain electrodes; and
    performing a heat treatment on the protective layer at a second temperature of about 330° C.;
    wherein the second temperature is higher than the first temperature.

5. The method of claim 4, wherein the deposition of the metal layer is performed using a chemical vapor deposition process.

6. The method of claim 5, wherein the source electrode and the drain electrode comprise aluminum, and
    the protective layer comprises one or more of a silicon nitride ($SiN_x$) or a silicon oxide ($SiO_x$).

7. The method of claim 6, further comprising forming a first electrode, an organic emission layer, and a second electrode on the source and drain electrodes.

* * * * *